United States Patent [19]
Zoiss et al.

[11] Patent Number: 5,666,715
[45] Date of Patent: Sep. 16, 1997

[54] ELECTRICALLY OPERATED IMPACT TOOL GUN

[75] Inventors: Edward J. Zoiss, Moorpark; Theodore E. Chavannes, Thousand Oaks, both of Calif.

[73] Assignee: Harris Corporation, Melbourne, Fla.

[21] Appl. No.: 498,242

[22] Filed: Jul. 5, 1995

[51] Int. Cl.⁶ ............ H01R 43/04; H05K 13/04
[52] U.S. Cl. ............ 29/566.4; 29/751; 173/117; 227/131
[58] Field of Search ............ 29/566.4, 566.3, 29/751, 750, 752, 758; 227/113, 131; 173/117, 13

[56] References Cited

U.S. PATENT DOCUMENTS

| | | | |
|---|---|---|---|
| 1,341,944 | 6/1920 | Study | 173/117 X |
| 2,635,854 | 4/1953 | Richards et al. | 173/117 |
| 2,967,302 | 1/1961 | Loveless | 173/117 |
| 3,251,524 | 5/1966 | Oussani | 227/131 |
| 3,733,674 | 5/1973 | Shirley | 29/751 |
| 4,237,987 | 12/1980 | Sherman | 173/117 |
| 4,300,282 | 11/1981 | Bunyea et al. | 29/566.4 |
| 4,349,143 | 9/1982 | Ewig | 227/131 |
| 4,491,262 | 1/1985 | Ewig | 227/131 |
| 4,492,880 | 1/1985 | Weiss | 307/252 |
| 4,770,335 | 9/1988 | Wingert | 227/139 |

FOREIGN PATENT DOCUMENTS

| | | | |
|---|---|---|---|
| 2334440 | 1/1975 | Germany | 29/751 |
| 3736031 | 5/1989 | Germany | 29/751 |

*Primary Examiner*—William R. Briggs
*Attorney, Agent, or Firm*—Charles E. Wands

[57] ABSTRACT

A pistol-configured, solenoid driven wire cutting and seating tool is connectable by way of a standard power cord to an AC voltage source and is used to seat and cut a wire by squeezing a trigger that operates a solenoid control circuit. The tool has a pistol-shaped grip and a generally cylindrically shaped barrel having a main barrel body and a nose portion. The solenoid has a bore adjacent to a butt region of the barrel, coextensive with a longitudinal axis of the barrel and accommodating the translation of a solenoid plunger. A solenoid plunger extension hammer extends from an end of the solenoid plunger, so that the plunger extension hammer extends into a generally annular cavity of the solenoid bore. Surrounding the solenoid plunger extension hammer is a solenoid return compression spring. A wire seating and cutting tool holder is axially translatable within the nose portion of the barrel. The tool holder receives a shaft of a wire seating and cutting tool and has a neck surrounded by a tool holder return compression spring. The solenoid control circuit includes an energizing current supply switch coupled in circuit with a power supply and the solenoid winding, and a switch control circuit, which is responsive to the operation of the trigger mechanism to render the energizing current supply switch conductive for a prescribed period of time and thereby apply an associated duration of firing current to the solenoid winding.

33 Claims, 7 Drawing Sheets

ELECTRICALLY OPERATED IMPACT TOOL GUN

FIELD OF THE INVENTION

The present invention relates in general to impact tools of the type employed in the telephone industry for inserting the free end of wires into resilient electrical terminals mounted to connector blocks of telephone office mainframes and remote terminals, and is particularly directed to a pistol-shaped, electrically operated wire cutting and/or seating tool gun for seating and cutting a wire by means of a tool-impacting solenoid-operated plunger hammer.

BACKGROUND OF THE INVENTION

The telephone industry currently offers its craftspersons a variety of manually operated impact tool configurations for cutting and/or seating individual telephone wires in terminal blocks that are mounted to telephone office mainframe and remote terminal units. For an illustration of documentation describing a variety of non-limiting examples of such manually operated impact tools, attention may be directed to U.S. Pat. Nos. 5,195,230, 4,696,090, 4,567,639, and 4,241,496 and the patents cited therein.

Typically, a mechanically operated impact tool has a generally longitudinal handle from which a wire-gripping and cutting head extends. The interior of the handle may contain an axially translatable hammer element, which is biased by a compression spring to strike the cutting head, and thereby cut one end of a wire that has been seized or inserted into a wire capture and gripping end region of the cutting head.

In accordance with the operation of one conventional tool configuration, the craftsperson grasps the impact tool handle and pushes it by hand against a wire in a terminal receptacle. A hammer release element within the handle is thereby moved into alignment with the hammer travel path, so that the force stored in a main compression spring is mechanically released, causing the hammer to be rapidly propelled toward and impact the cutting head, so that the end of the wire is cut and becomes seated in the terminal.

One of the principal shortcomings of one type of mechanical impact tools currently in use is the need for the craftsperson to push the handle with more force than is required to compress the main spring. This need for additional force is due to the fact that the hammer release element employs a (wedge-configured) push-plate that must be moved transverse to the hammer's translation axis, in order to achieve alignment with an insertion slot, and allow the hammer to be released. Since the push-plate is moved by the application of force along the handle axis, the total amount of axially imparted force required to operate the tool is that required to both compress the main spring and move the push-plate. As a consequence, its use is time-consuming and labor-intensive, thereby increasing the cost of installation of telephone equipment. Thus, it would be desirable to reduce the amount of effort required to operate such a tool, and thereby lessen the labor burden on the craftsperson.

SUMMARY OF THE INVENTION

In accordance with the present invention, this objective is achieved by means of a (pistol-configured) electrical solenoid-driven wire cutting and seating tool gun, which is connectable by way of a standard power cord to an AC voltage source and is operative to seat and cut a wire simply by the operator 'squeezing' a trigger mechanism which operates an internal solenoid control circuit. More particularly, the solenoid driven impact tool according to the invention comprises a pistol-shaped housing having a pistol grip and a generally cylindrically shaped barrel portion. The barrel portion has a main barrel body and a nose portion that extends from the main barrel body.

The pistol grip contains a solenoid control circuit, which is coupled by way of an electrical power supply cord to a source of external AC power (120 VAC, 60 Hz). A finger-manipulated trigger mechanism is installed in the pistol grip for enabling an operator to initiate operation of the solenoid control circuit, which supplies energizing current of a prescribed duration to a solenoid winding that is supported within the main barrel body.

The solenoid winding has a first axial bore or passageway which is coextensive with and immediately adjacent to a second axial bore or passageway within a butt region of the barrel. These adjacent axial bores are coaxial with the longitudinal axis of the barrel and are sized to accommodate the translation of a solenoid plunger. A solenoid plunger rebound cushion at the butt region of the barrel provides a shock-absorbing surface for a rear face of the solenoid plunger, when the solenoid plunger is returned to its at rest or 'pre-firing' position.

A generally longitudinal solenoid plunger extension hammer made of a durable, non-magnetic material, is inserted into a bore formed in an end portion of the solenoid plunger, so that the plunger extension hammer is solid with the solenoid plunger and extends into a generally annular cavity of the solenoid bore. Surrounding the solenoid plunger extension hammer is a solenoid return compression spring, captured between an end face of the solenoid plunger and an end cap that is affixed to a neck portion of a wire cutting and/or seating tool holder.

The wire cutting and/or seating tool holder is axially translatable within a further coaxial bore extending through the nose portion of the barrel. Extending from the neck portion of the wire cutting and/or seating tool holder is a slightly larger diameter portion that projects from a forward end of the nose portion of the barrel. This slightly larger diameter portion of the tool holder has an axial bore that is sized to receive a shaft of a wire cutting and/or seating tool.

The neck portion of the cutting and/or seating tool holder has a generally flat end face which is axially spaced apart from a flat end face of a distal end of the solenoid plunger extension hammer by a solenoid return compression spring. Surrounding the neck portion of the cutting and/or seating tool holder, within a generally annular cavity formed between the tool holder and the interior surface of a wider diameter bore portion of the nose axial bore is a tool holder return compression spring. When the cutting and/or seating tool holder is located at its 'at rest' position, an end face of the wider diameter portion of the tool holder abuts against an end face of a wider diameter bore portion of the nose bore.

The solenoid control circuit includes a pair of AC power cord terminals which are terminated by respective line ends of the AC power cord. One terminal is coupled to a first end of the solenoid winding. A second end of the solenoid winding is coupled through a firing switch element, such as a silicon controlled rectifier (SCR), to a reference terminal (ground). A second power cord terminal is coupled to ground. The one power cord terminal is further resistor-coupled to the anode of a half-wave rectifier, which supplies a reduced amplitude rectified DC voltage for powering the components of the solenoid control circuit.

The input power terminal is further resistor-coupled to voltage signal conditioning circuit comprising a Zener diode and a capacitor coupled to ground. The voltage signal conditioning circuit clips the level and controls the rate of rise of the input voltage signal. The conditioned line voltage signal is coupled to a first one-shot circuit, the output of which changes state with a rising edge of the conditioned signal after the trigger has been squeezed. The first one-shot circuit has its reset input coupled to the output of a second one-shot circuit, which changes state in response to the operation of the trigger switch. The output of the first one-shot circuit is coupled to a third one-shot circuit, an inverted output of which is coupled to a fourth one-shot circuit.

When the operator squeezes the trigger, the next rising edge of the conditioned line voltage signal initiates time outs of respectively different durations in the first and third one-shots. When the third one-shot circuit times out, it triggers the fourth one-shot circuit. A non-inverted output of the third one-shot circuit is coupled to a first input terminal of a solenoid current duration selection switch, a second input terminal of which is coupled to the output of the fourth one-shot circuit. The common terminal of the solenoid current duration selection switch is coupled to the gate of the SCR.

When the operator squeezes the trigger mechanism, the solenoid control circuit is operative to supply a solenoid 'firing' current pulse of a prescribed magnitude and duration, that is defined in accordance with the setting of the solenoid current duration selection switch, so as to control the wire seating and cutting impact stroke of the solenoid plunger.

In the 'at rest' or 'pre-firing' state of the tool, the solenoid return compression spring biases the solenoid plunger extension hammer away from the cutting tool holder, so that the solenoid plunger is urged into abutment with the solenoid rebound cushion. In this position, the main body portion of the solenoid plunger is positioned only partially in the solenoid winding's axial bore. In addition, the tool holder return compression spring biases the seating and cutting tool holder toward the solenoid winding so that the tool holder abuts against the end face of the second wider diameter bore portion of the axial bore through the barrel nose.

To begin seating and/or cutting one or more wires engaged by a cutting and/or seating tool that has been installed in the cutting tool holder, the craftsperson squeezes the trigger mechanism, whereby the solenoid control circuit supplies a 'firing' current pulse to the solenoid winding, which provides a prescribed wire seating and/or cutting impact stroke of the solenoid plunger. When the solenoid winding is energized by the current pulse, the solenoid plunger is rapidly translated along the axial bore of the butt region of the barrel and into the axial bore of the solenoid. As the solenoid plunger is propelled into the solenoid bore, its solenoid plunger extension hammer is translated toward the cutting tool holder, and begins to compress the solenoid return compression spring against the end cap on the neck portion of the cutting tool holder.

Further axial translation of the solenoid plunger causes the end face of the distal end of the solenoid plunger extension hammer to strike the end face of the neck portion of the cutting tool holder, whereby the wire seating and/or cutting tool attached to the tool holder seats and cuts, or seats only, one or more wires in the terminal block. During this striking action, the cushion sleeve member installed against the interior end surface of the wider diameter portion of the axial bore through the barrel nose absorbs the impact of the end cap on the neck portion of the cutting tool holder.

When the solenoid energizing pulse terminates, the restoration energy stored in the return compression springs is released, causing each of the solenoid plunger and the tool holder to gradually return to their at rest positions, so that the tool is ready for seating and/or cutting another wire or wires. During the return movement of the solenoid plunger back into the first axial bore, the solenoid plunger rebound cushion member absorbs energy upon impact of the solenoid plunger with the butt end of the barrel. Similarly, the tool holder compression spring absorbs energy in the tool holder in the course of its being returned toward the solenoid winding, until the end face of the tool holder abuts against the end face of the second wider diameter bore portion of the axial bore through the barrel nose.

DETAILED DESCRIPTION

Figure 1:
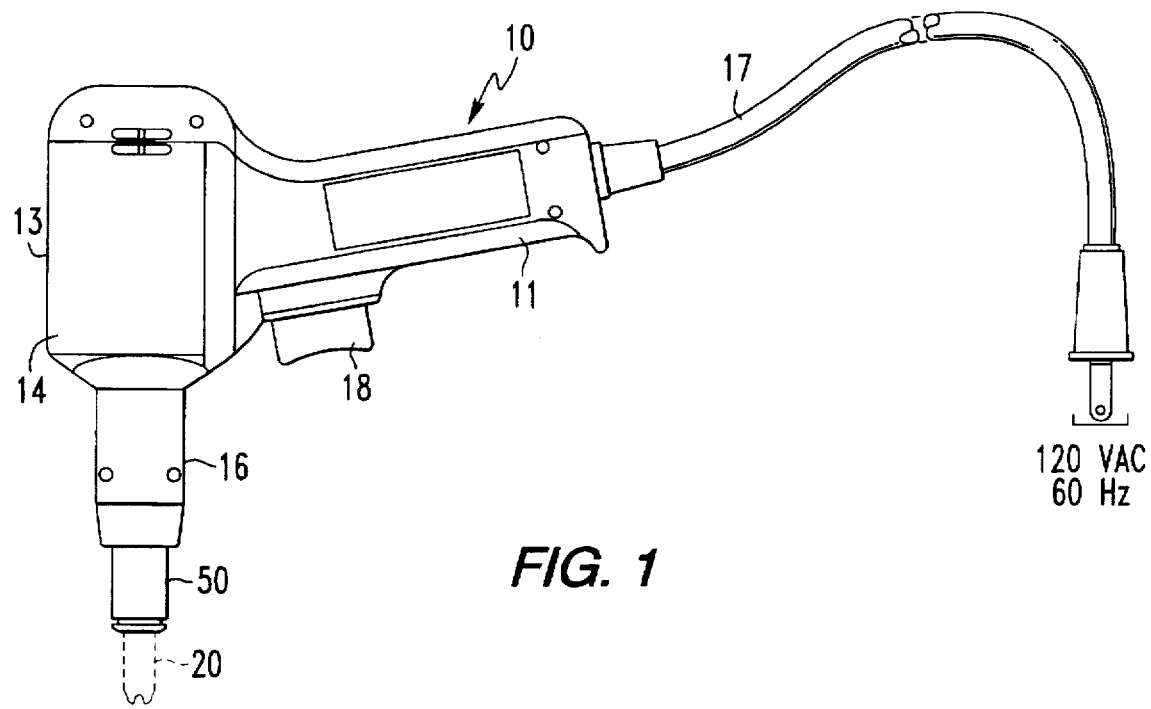
FIG. 1 is a diagrammatic external side view of an embodiment of a pistol-configured, electrically driven wire cutting and seating tool gun in accordance with the present invention.

Referring now to FIG. 1, an external side view of an embodiment of a pistol-configured, electrically driven wire cutting and seating tool gun in accordance with the present invention is diagrammatically illustrated as comprising a 'pistol'-configured housing 10 having a generally hollow pistol grip 11 and a generally cylindrically shaped hollow barrel 13 integral therewith. Generally cylindrically shaped barrel portion 13 has a main cylindrical barrel body portion 14 which is integrally interfaced with the pistol grip 10 and a nose portion 16 that extends from the main barrel body portion 14. A wire seating and cutting tool is shown generally in broken lines 20 extending from a tool holder 50 in the nose portion 16.

Figure 2:
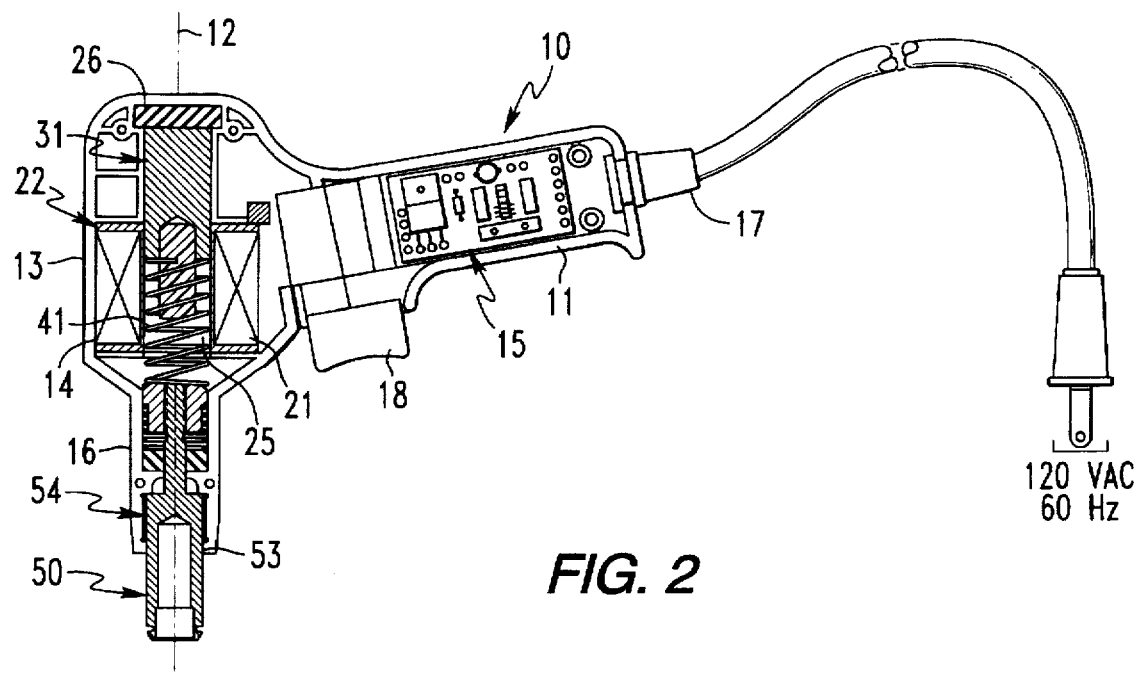
FIG. 2 is a diagrammatic interior sectional side view of FIG. 1.

As further shown in FIG. 2, which is an interior sectional view of FIG. 1 taken through a plane which contains a longitudinal axis 12 of the barrel 13, pistol grip 11 houses a solenoid control circuit 15 (to be described below with reference to FIGS. 12 and 13), which is coupled through an electrical power supply cord 17 to a source of external AC power (120 VAC, 60 Hz). A spring-biased trigger mechanism 18 is installed in the pistol grip portion of the housing for controlling the operation of the solenoid control circuit.

In response to an operator manipulating (squeezing) the trigger mechanism 18, the solenoid control circuit 15 supplies a prescribed magnitude and duration of energizing current to a generally cylindrically configured solenoid winding 21, supported within a bobbin 22 in the main barrel body portion 14 of the tool adjacent to the pistol grip 11.

Figure 3:
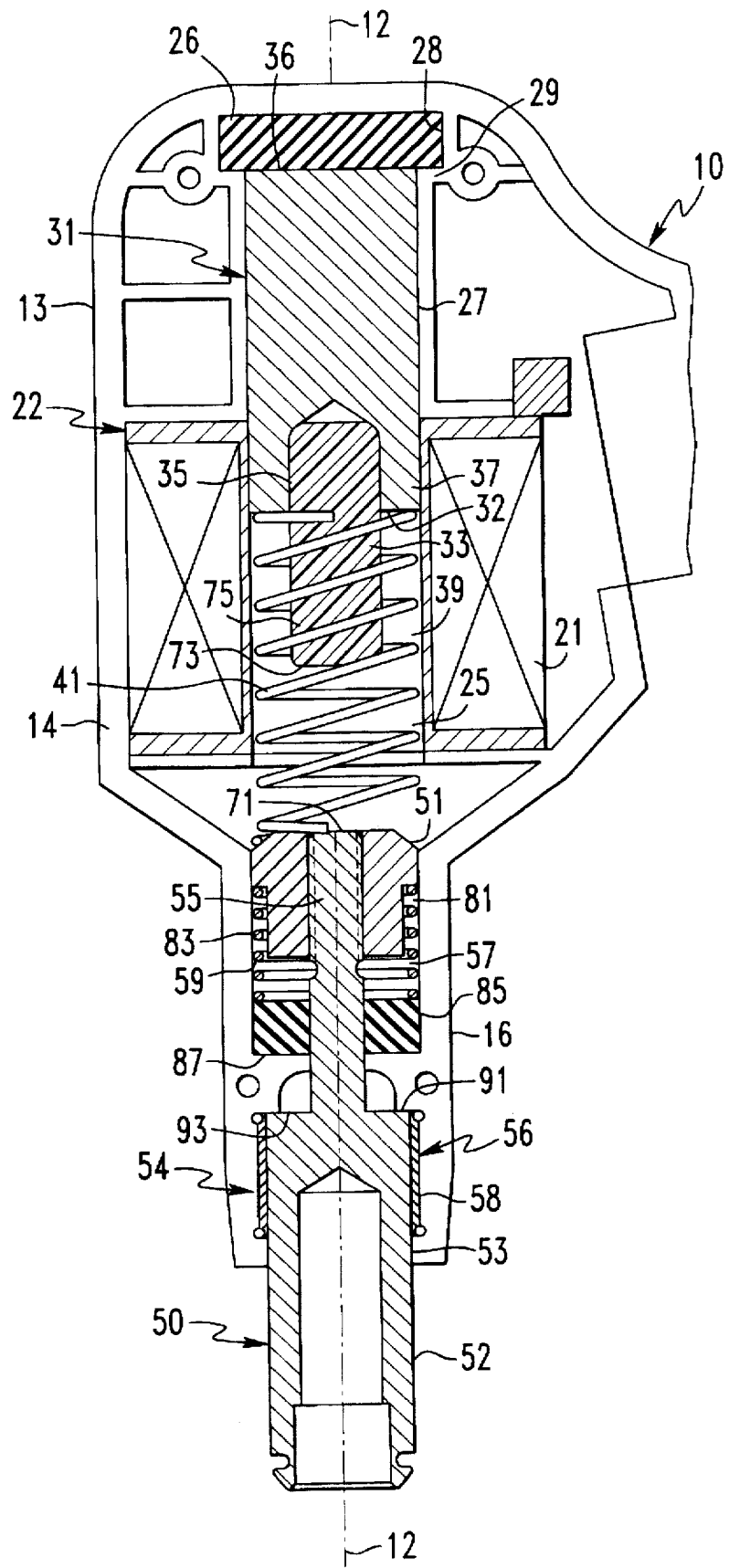
FIG. 3 is an enlarged internal sectional view of the barrel of the pistol-configured, electrically driven wire cutting and seating tool gun shown in FIG. 2.

As shown in enlarged detail in the internal sectional view of the barrel in FIG. 3, bobbin-mounted solenoid winding 21 has an axial bore or passageway 25, which is coextensive with and immediately adjacent to an axial bore or passageway 27 within a butt region 29 of the barrel portion 13 of the tool housing. Axial bores/passageways 25 and 27 are coaxial with the longitudinal axis 12 of the barrel portion 13 and are sized to accommodate the translation therethrough of a generally cylindrical solenoid plunger 31 made of magnetic material. A generally disc-shaped solenoid plunger rebound cushion member 26 is captured within an interior end cavity 28 at the butt region 29 of the barrel 13. Solenoid plunger rebound cushion member 26 is made of a shock absorbing material such as rubber and is operative to provide a shock-absorbing surface for a rear face 36 of solenoid plunger 31, when the solenoid plunger 31 is gradually returned to the pre-firing or at rest position shown in FIGS. 2 and 3, after a tool impact and return operational sequence, to be described.

Figure 6:
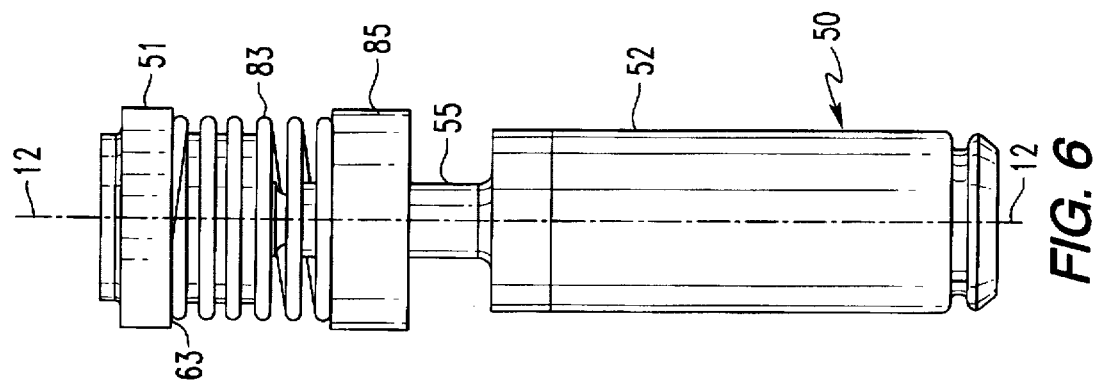
FIG. 6 diagrammatically illustrates the manner in which a tool holder return compression spring is captured between a lip portion of an end cap and a shock-absorbing cushion sleeve member.
Figure 4:
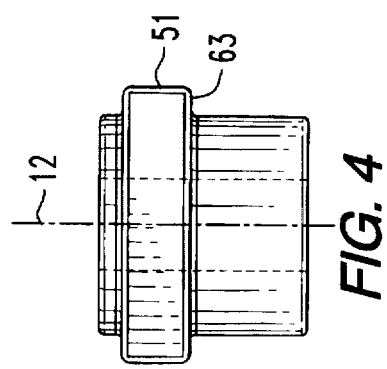
FIGS. 4 and 5 are respective side and axial views of the end cap of FIGS. 2 and 3.
Figure 5:
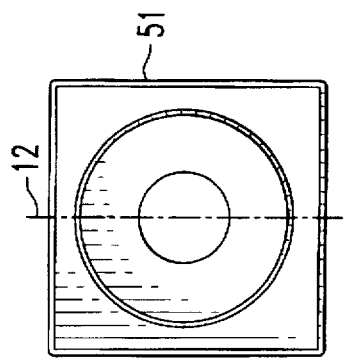

A generally cylindrically shaped, longitudinal solenoid plunger extension hammer 33, which is made of a durable, non-magnetic material, such as a resilient synthetic material, such as a hard plastic, is solidly inserted into and captured within a bore 35, formed in an end portion 37 of solenoid plunger 31, so that solenoid plunger extension hammer 33 is integral with the solenoid plunger 31. Surrounding solenoid plunger extension hammer 33 within a generally annular cavity region 39 of solenoid bore 25 is a solenoid return compression spring 41, which is captured between an end face 32 of solenoid plunger 31 and an end cap 51, shown in detail in respective side and axial views of FIGS. 4 and 5. As shown in FIGS. 3 and 6, end cap 51 is mounted to the end of a neck portion 55 of a generally longitudinal wire seating and cutting tool holder 50, shown per se in FIG. 7.

Figure 7:
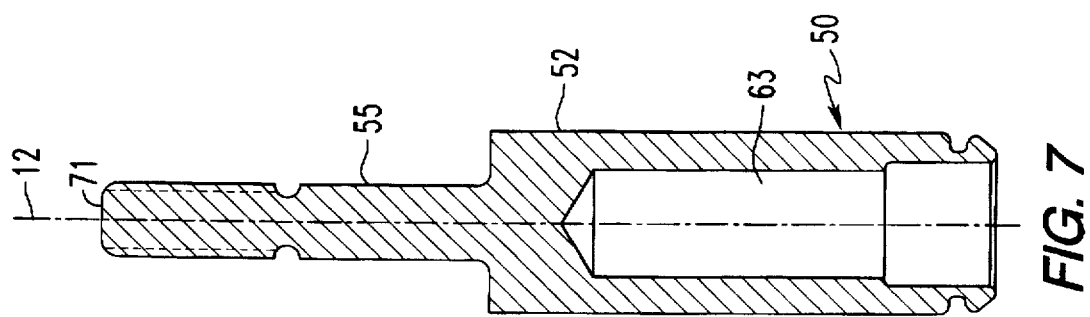
FIG. 7 is a sectional view of a generally longitudinal wire seating and cutting tool holder.

Wire seating and cutting tool holder 50 has a generally square cross-sectional body portion 52 that extends through a generally square axial bore 53 of the nose portion, which extends through and is coaxial with the nose portion 16 of the barrel 13. As shown in FIG. 7, the body portion 52 of tool holder 50 has an axial bore 63, which is sized to receive a shaft of wire seating and cutting tool 20. A pair of generally rectangular U-shaped steel sleeves 54 and 56 surround the generally square cross-sectional body portion 52 of tool holder 50 and provide a rigid, protective encasement for the body portion 52 within a square cavity portion 58 of bore 53. The reduced diameter, generally cylindrical neck portion 55 of tool holder 50 extends from the generally square cross-sectional body portion 52 thereof and enters into a generally square cross-sectional nose cavity 57 coaxial with longitudinal axis 12.

The neck portion 55 of the cutting tool holder 50 has a generally flat end face 71 which is normally axially spaced apart from a flat end face 73 of a distal end 75 of solenoid plunger extension hammer 33, by virtue of solenoid return compression spring 41. Surrounding neck portion 55 of the cutting tool holder 50, within a generally annular cavity portion 81 formed between the neck portion 55 of tool holder 50 and the interior surface 59 of cavity 57 is a tool holder return compression spring 83.

As shown in FIG. 6, tool holder return compression spring 83 is captured between a lip portion 63 of end cap 51 and a shock-absorbing (rubber) cushion sleeve member 85. As shown in FIG. 3, cushion sleeve member 85 is installed against an interior end surface 87 of cavity 57. When the cutting tool holder 50 is positioned in its 'at rest' or return position (shown in FIGS. 2 and 3), an end face 91 of the generally square cross-sectional body portion 52 abuts against an end face 93 of bore 53.

OPERATION

The operation of the electromechanical portion of the electrically driven wire cutting and seating tool of the present invention may be readily understood with reference to FIGS. 8–11, which diagrammatically illustrate the relative positions of the tool displacement components supported within the barrel portion of the tool housing, at successive stages of the tool's operation after being 'electrically fired' by an operator squeezing trigger mechanism 18. It will be understood that, immediately prior to squeezing the trigger mechanism 18 and thereby initiating an electrically driven wire seating and cutting operation, the impact tool gun 10 is positioned so that the seating and cutting head of the tool that has been installed in the tool holder 50 is urged against a wire to be inserted into a terminal of a terminal block.

Figure 8:
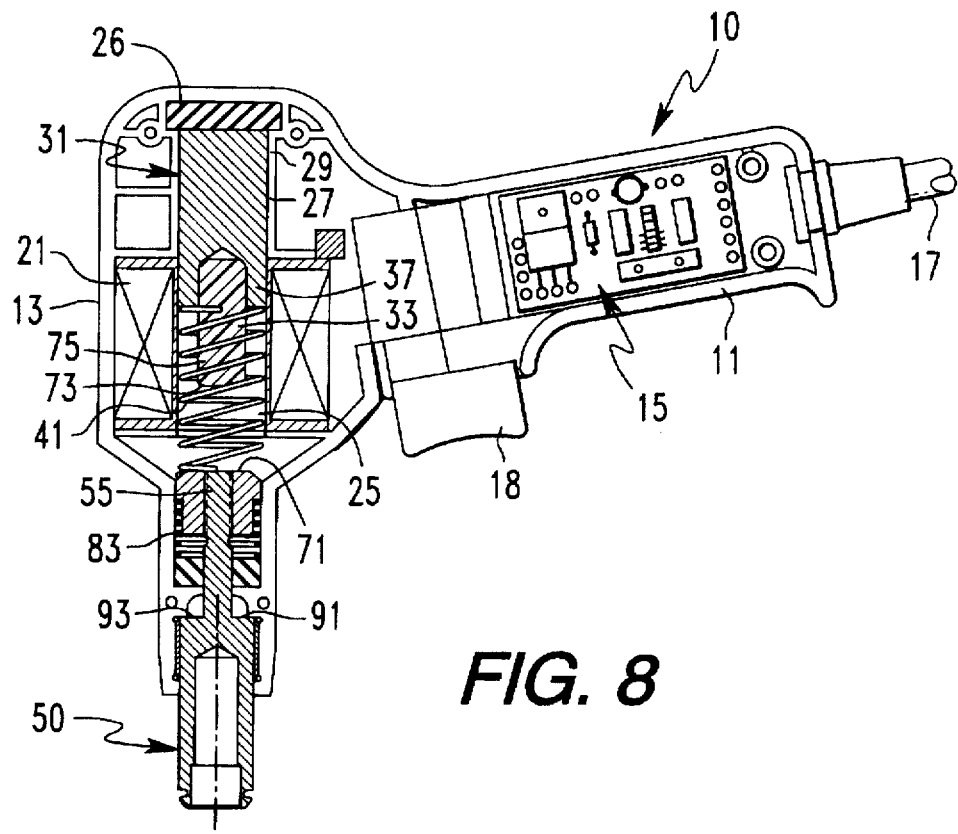
FIGS. 8-11 diagrammatically illustrate the relative positions of the tool displacement components supported within the barrel portion of the tool housing, at successive stages of the tool's operation.

In the 'at rest' state of the tool, shown in FIG. 8, solenoid return compression spring 41 biases the end face 71 of the neck portion 55 of the cutting tool holder 50 axially away from the end face 73 of a distal end 75 of the solenoid plunger extension hammer 33, so that the solenoid plunger 31 is urged into axial bore 27 and abuts against the solenoid rebound cushion member 26 at the butt region 29 of the barrel 13. In this at rest position, the main body portion of the solenoid plunger 31 is positioned in the axial bore 27, while the end portion 37 of the solenoid plunger 31, into which the longitudinal solenoid plunger extension hammer 33 is fitted, extends partially into axial bore 25. Also, the tool holder return compression spring 83 biases the tool holder 50 toward the solenoid winding 21, so that the end face 91 of the generally square cross-sectional body portion 52 abuts against an end face 93 of cavity 57.

To begin seating and cutting a wire engaged by a cutting and seating tool that has been installed in the tool holder 50, the craftsperson squeezes the trigger mechanism 18. As pointed out briefly above, in response to an operator squeezing the trigger mechanism 18, the solenoid control circuit 15 within the pistol grip 11 supplies a 'firing' current pulse of a prescribed magnitude and duration to solenoid winding 21. As described previously, the characteristics of the solenoid firing current pulse are defined so as to provide for a prescribed wire seating and cutting impact stroke of the solenoid plunger 31. When the current pulse terminates, the restoration energy in the compression springs 41 and 83 act to gradually return the components in the barrel 13 to their positions shown in FIGS. 2, 3 and 8. (As noted earlier, the duration of the current pulse may be selected to one of a plurality of different periods of time and thereby apply a selected one of a plurality of associated durations of energizing current to the solenoid, and thereby control the amount of impact force imparted by the solenoid plunger extension hammer 33 to the tool holder 50.)

Figure 9:
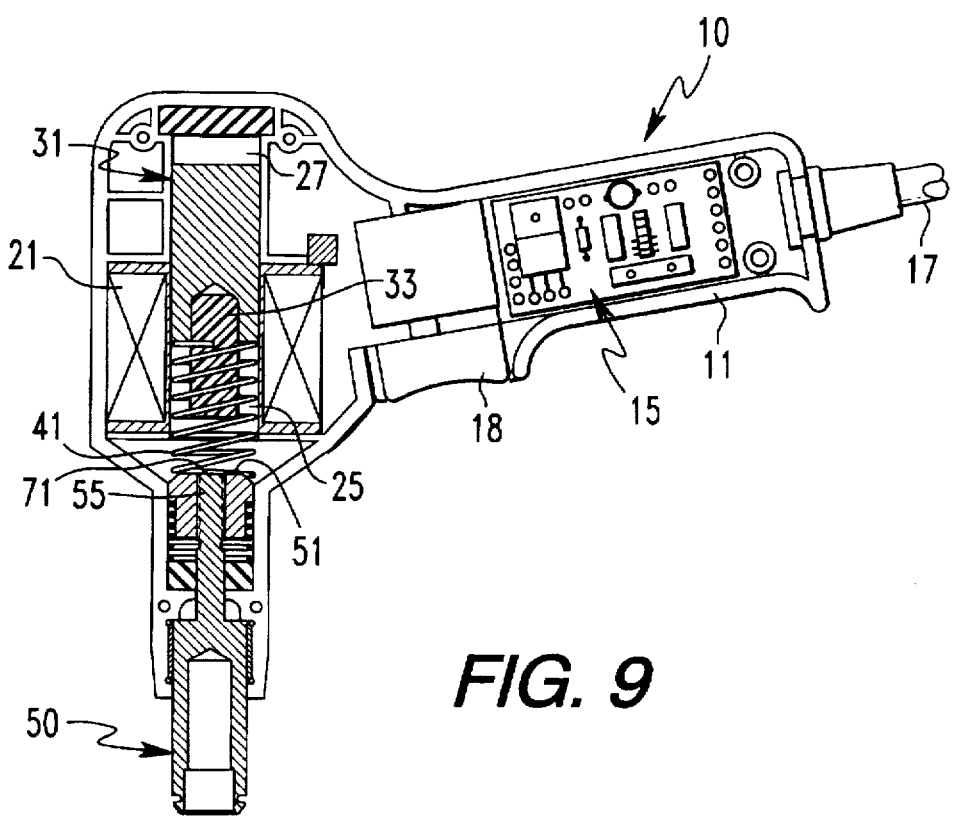

With the solenoid winding 21 energized by the current pulse supplied by control circuit 15, the solenoid plunger 31 is rapidly translated from the axial bore 27 of the butt region of the barrel along the longitudinal axis 12 and into the axial bore 25 of the solenoid, as shown in FIG. 9. As the solenoid plunger 31 is propelled into the axial bore 25, its solenoid plunger extension hammer 33 is translated toward the neck portion 55 of cutting tool holder 50. This translation of solenoid plunger 31 also begins to compress the solenoid return compression spring 41 against the end cap 51 captured on the neck portion 55 of the cutting tool holder 50.

Figure 10:
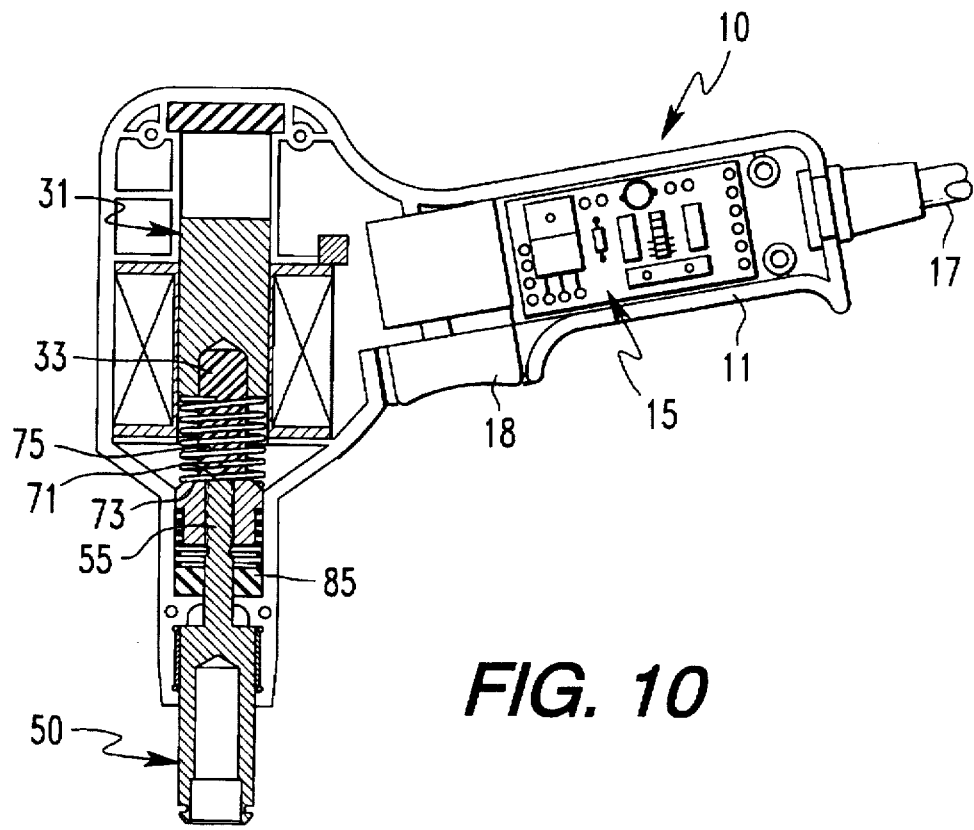
Figure 11:
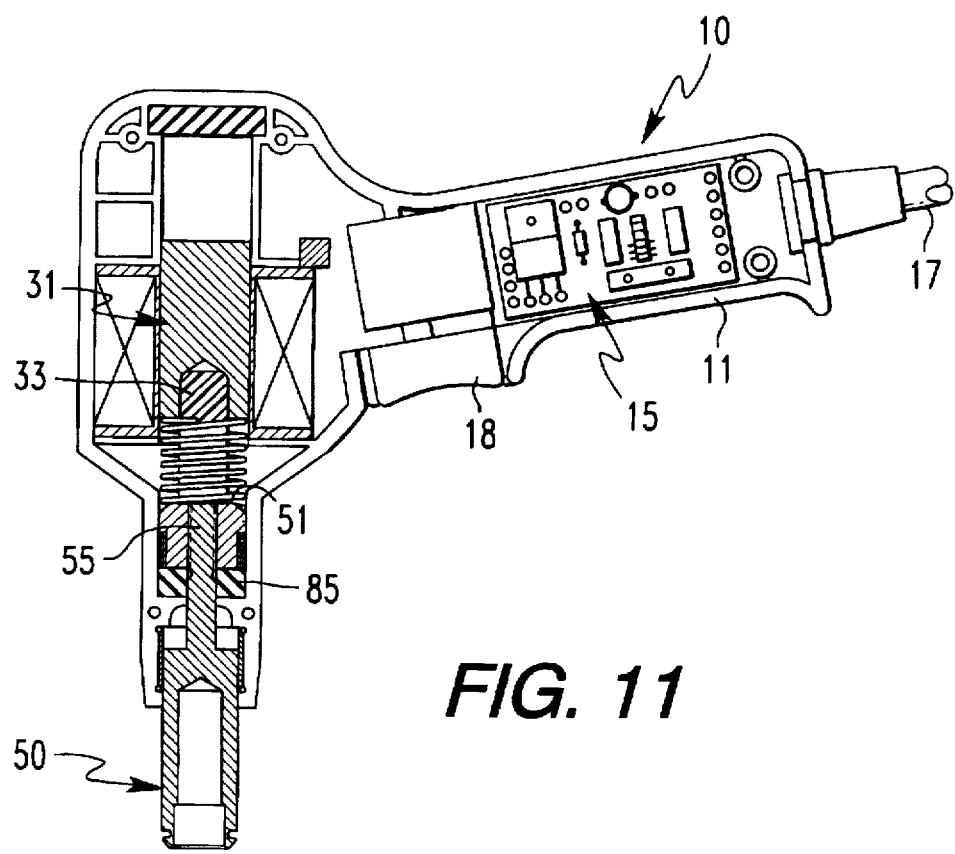

As shown in FIGS. 10 and 11, further continued axial translation of the solenoid plunger 31 brings end face 73 of the distal end 75 of the solenoid plunger extension hammer 33 into engagement with the end face 71 of the neck portion 55 of the cutting tool holder 50. This 'striking' of the end face 71 of the neck portion 55 of the cutting tool holder 50 by the solenoid plunger extension hammer 33 causes the wire seating and cutting tool attached to the holder 50 to seat and/or cut one or more wires in the terminal block. During this impact or striking action, the cushion sleeve member 85 absorbs the impact of the end cap 51 on the neck portion 55 of the cutting tool holder 50.

When the solenoid energizing pulse terminates, the restoration energy stored in compressed springs 41 and 83 takes over to return each of the solenoid plunger 31 and the tool holder 50 to their positions shown in FIGS. 2, 3 and 8, so that the tool is ready for seating and/or cutting another wire. During the gradual return movement of the solenoid plunger 31 back into axial bore 27 (as a result of the bias imparted by solenoid return compression spring 41), solenoid plunger rebound cushion member 26 serves to absorb energy upon impact of the solenoid plunger with the butt region 29 of the barrel 13. Similarly, compression spring 41 serves to absorb energy in the tool holder 50 in the course of its being biased by return spring 83 toward the solenoid winding 21 until the end face 91 of the generally square cross-sectional body portion 52 abuts against end face 93 of cavity 57.

Figure 12:
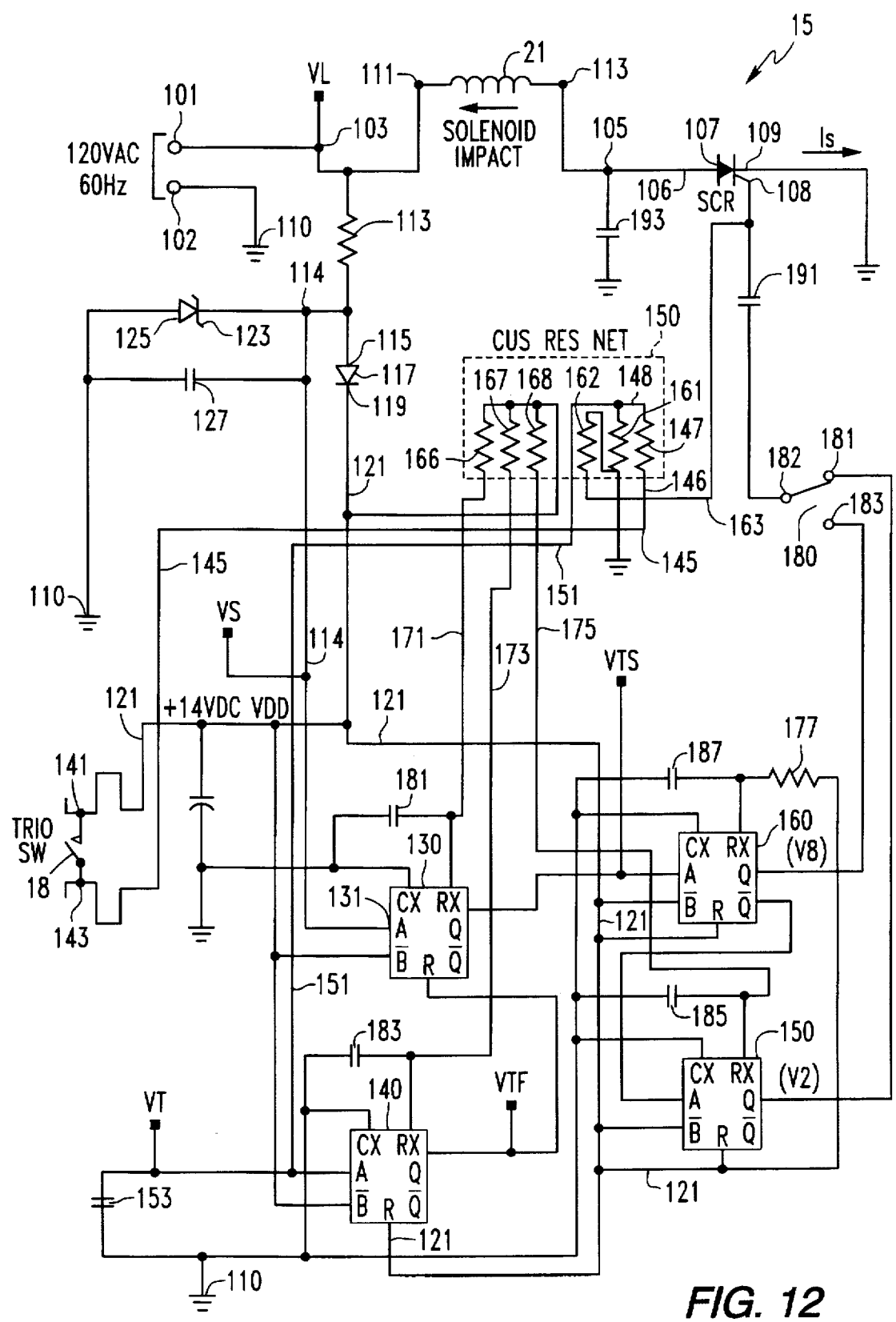
FIG. 12 schematically illustrates the configuration of a solenoid control circuit.
Figure 13:
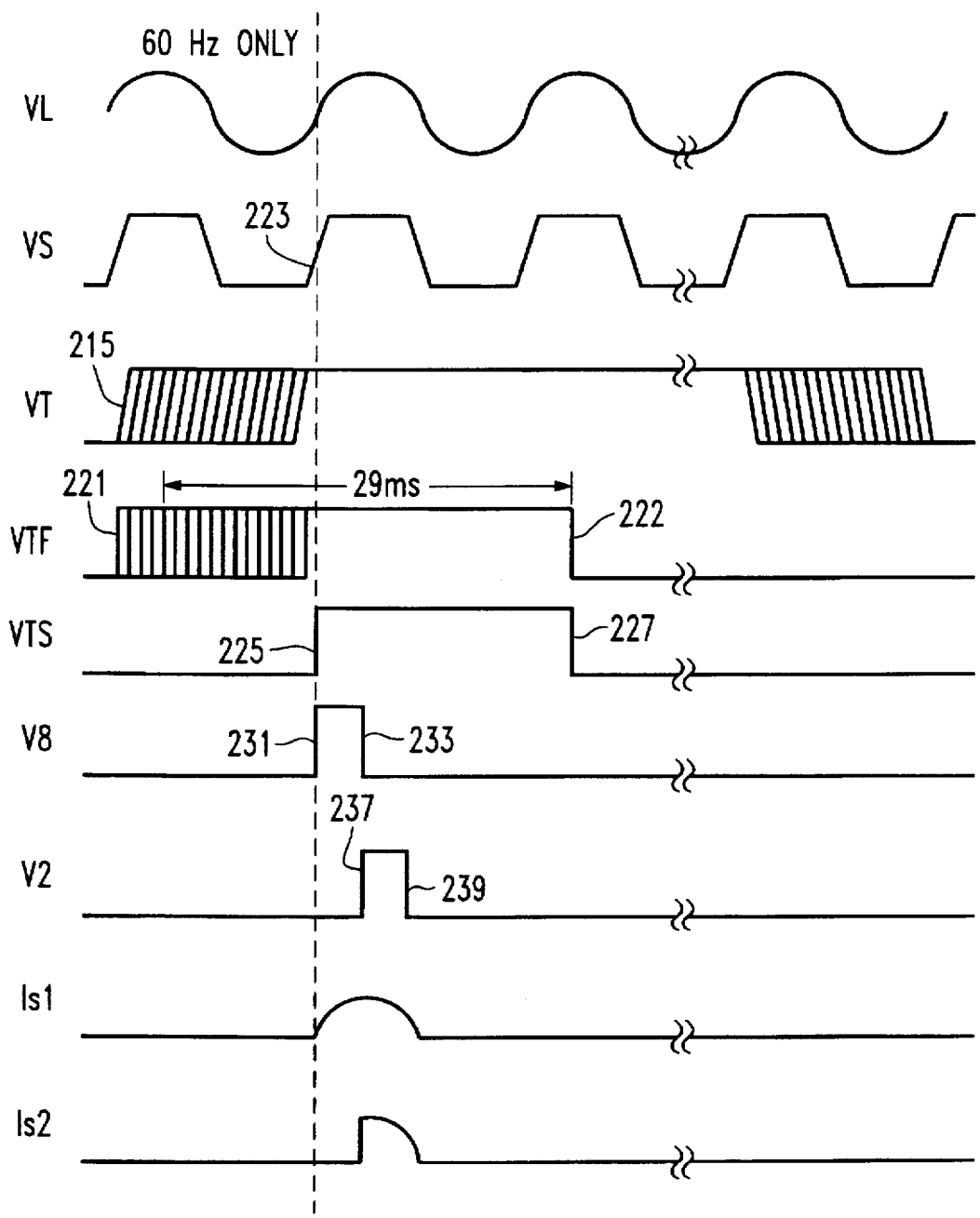
FIG. 13 shows a set of timing diagrams illustrating the operation of the solenoid control circuit of FIG. 12.

Referring now to FIG. 12, the solenoid control circuit 15, that is installed in the pistol grip portion 11 of the housing 10, is schematically illustrated as comprising a pair of AC power cord terminals 101 and 102, which are terminated by respective line ends of (120 VAC, 60 Hz) power cord 17. Terminal 101 is further coupled to a terminal 103, which is coupled to a first end 111 of solenoid winding 21, a second end 113 of which is coupled to a terminal 105. Terminal 105 is coupled to a firing switch element, shown as a silicon controlled rectifier 107, to be described.

Power cord terminal 102 is coupled to ground 110, while power cord terminal 101 is coupled through a resistor 113 to a line 114 and to the anode 115 of a diode 117, the cathode 119 of which is coupled to a (VDD) line 121. Line 114 is coupled to the cathode 123 of a Zener diode 125 and to a capacitor 127. Zener diode 125 and capacitor 127 are coupled to ground 110, and serve to clip the level and control the rate of the input voltage signal on line 114.

Line 114 is further coupled to the A input 131 of a first one-shot circuit 130. One-shot circuit 130, and the other one-shot circuits to be described triggers on a positive-going edge applied to its A input. Its Q output goes high coincident with the A input and stays high for the time-out duration of the circuit, unless reset earlier by a reset signal applied to its Reset input.

(VDD) line 121 is coupled to a first terminal 141 of trigger switch mechanism 18. A second terminal 143 of trigger switch mechanism 18 is coupled via line 145 to a first side 146 of a first resistor 147 of a resistor network 150. A second side 148 of resistor 147 is coupled via a line 151 to the A input of a second one-shot circuit 140. Line 151 is terminated to ground 110 through trigger switch debounce capacitor 153. Resistor network 150 further includes a second resistor 161, which also terminates line 151 to ground.

A second portion of resistor network 150 includes first, second and third resistors 166, 167 and 168, which are coupled through respective lines 171, 173 and 175 to RX terminals of one-shot circuits 130, 140 and 150. The RX terminals of one-shot circuits 130, 140 and 150 are coupled through respective timing resistors 166, 167 and 168 to (VDD) line 121. The RX terminals of one-shot circuits 130, 140 and 150 are capacitor-coupled to ground 110 through timing capacitors 181, 183 and 185, respectively. A further one-shot 160 has its RX terminal coupled to ground through timing capacitor 187. The RX terminal of one-shot circuit 160 is coupled through timing resistor 177 to (VDD) line 121. The CX terminal of each of the one-shot circuits is coupled directly to ground.

The Reset terminal of one-shot circuit 130 is coupled to the Q output of one-shot circuit 140, while the Reset terminals of one-shot circuits 140, 150 and 160 and the BBAR inputs of one-shot circuits 130, 140, 150 and 160 are coupled to line (VDD) 121. The Q output of one-shot circuit 130 is coupled to the A input of one-shot circuit 160, while the QBAR output of one-shot circuit 160 is coupled to the A input of one-shot circuit 150. The Q output of one-shot circuit 150 is coupled to a first terminal 181 of a switch 180, a second terminal 183 of which is coupled to the Q output of one-shot circuit 160. The common terminal 182 of switch 180 is coupled through a capacitor 191 to the gate 108 of silicon-controlled rectifier 107, the cathode 109 of which is coupled to ground, and the anode 106 of which is coupled to terminal 113 of solenoid winding 21. Gate 108 of silicon-controlled rectifier 107 is coupled to ground 110 through terminating resistor 162 within resistor network 150. A noise bypass capacitor 193 is coupled between terminal 105 and ground.

OPERATION

As described previously, in response to the operator squeezing the trigger mechanism 18, the solenoid control circuit of FIG. 12 is operative to supply a solenoid 'firing' current pulse of a prescribed magnitude and duration defined to provide for the wire seating and cutting impact stroke of the solenoid plunger. With the power cord 17 plugged in to a source of AC voltage (120 VAC, 60 Hz), shown at VL in set of timing diagrams of FIG. 13, a reduced magnitude line voltage provided through resistor 113 is rectified by diode 117 and applied to line (VDD) 121. The rectified voltage on (VDD) line 121 may be on the order of +14 VDC. As noted previously, the parallel connection of Zener diode 125 and capacitor 127 from ground to line 114 operates to hard-limit and sharpen the 60 Hz voltage signal on line 114, as shown at VS.

In response to the operator squeezing trigger switch mechanism 18, bridging terminals 141 and 143, the hard-limited voltage on line 114 is coupled through trigger switch mechanism 18—line 145—resistor 147 of resistor network 150—line 151, causing the voltage level at the A input of one-shot circuit 140 to go high, as shown at an arbitrary rise point 215 of a signal VT. This low to high transition at the A input of one-shot circuit 140 causes its Q output to go high, as shown at point 221 in signal VTF, and remain high for a prescribed time-out period (e.g. 29 milliseconds), and then go high to low, as shown at 222 in signal VTF.

With the closure of contacts of trigger switch mechanism 18, which causes the Q output of one-shot circuit 140 to go to the high state, which is directly coupled to the Reset terminal of one-shot 130, the next rising edge of the sharpened voltage signal on line 114, shown at 223 in the signal VS, causes the Q output of one-shot 130 to go high, as shown at 225 of a signal VTS. This function is critical, as it ensures one, and only one, current pulse (Is1 or Is2) for every closure of the trigger switch contacts. Further, each current pulse has the correct width for reliable cutting and/or seating of the wire(s) in the terminal block. The signal VTS goes low coincident with signal VTF, as shown at 227.

Since this low to high transition at the Q output of one-shot circuit 130 is applied to the A input of one-shot circuit 160, the Q output of one-shot circuit 160 goes high coincidently with the rising edge of the signal VTS, as shown at 231 in signal V8. The signal V8 remains high for the prescribed time-out period of one-shot circuit 160 (e.g. several milliseconds), and then goes high to low, as shown at 233.

When the Q output of one-shot circuit 160 goes low at 233, its QBAR output, which is applied to the A input of one-shot circuit 150, goes high, thereby causing the Q output of one-shot circuit 150, shown as signal V2, to go high at 237 coincidentally with the falling edge of the signal V8. Like the signal pulse V8, the signal pulse V2 remains high for the prescribed time-out period of one-shot circuit 150 (e.g. several milliseconds), and then goes high to low, as shown at 239.

Depending upon the switch setting of switch 180, the gate 108 of silicon-controlled rectifier 107 will be turned on by either the Q output of one-shot circuit 150 or the Q output of one-shot circuit 160, so that the current pulse through solenoid winding 21 will have either a wide duration as shown at Is1, or a narrow duration, as shown at Is2. Namely, one-shot circuits 150 and 160, in combination with switch 180, allow the operator to select one of a plurality of different periods of time for the duration of the firing pulse to the silicon controlled rectifier 107, and thereby enable a selected one of a plurality of associated durations of energizing current to be applied to the solenoid winding 21.

If the option of setting current pulse duration is not desired, one-shot circuits 150 and 160 and switch 180 may be omitted, with the Q output of one-shot circuit 130 coupled directly to the gate 108 of silicon controlled rectifier 107 through capacitor 191, whereby the signal VTS at the Q output of one-shot circuit 130 will control the magnitude and duration of the solenoid current pulse. By providing selection switch 180, however, the solenoid control circuit is capable of permitting adjustment of the amount of energizing current supplied to the solenoid winding 21 and thereby controlling the magnitude of the impact force imparted by said solenoid plunger extension hammer 33 to the wire cutting tool holder 50.

As will be appreciated from the foregoing description, the pistol-configured electrical solenoid driven, wire cutting and seating tool of the present invention readily enables an operator to seat and cut a wire simply by 'squeezing' a trigger mechanism that operates the internal solenoid control circuit of the tool. This overcomes a major disadvantage of mechanical impact tools, which require that the craftsperson physically push the handle with a substantial amount of force (typically more force than is required to compress the main spring of the tool). Thus, the present invention reduces the amount of effort required to operate the tool, and thereby lessens the labor burden on the craftsperson.

While we have shown and described an embodiment in accordance with the present invention, it is to be understood that the same is not limited thereto but is susceptible to numerous changes and modifications as known to a person skilled in the art, and we therefore do not wish to be limited to the details shown and described herein but intend to cover all such changes and modifications as are obvious to one of ordinary skill in the art.

What is claimed:

1. An electrically operated impact tool for use with a utility device comprising a housing, which includes an impact mechanism support portion, and having a switch mechanism through which an operator causes a solenoid control circuit to operate a solenoid contained in said impact mechanism support portion, said solenoid having an axial passageway therethrough, which is sized to accommodate the translation of a solenoid plunger along a longitudinal axis of said axial passageway, a generally longitudinal solenoid plunger extension hammer attached to said solenoid plunger, an impact tool holder having a first end which is arranged to be struck by said solenoid plunger extension hammer by the operation of said solenoid, and a second end to which an impact tool element is attached, a first return spring supported within said axial passageway through said solenoid and normally urging said solenoid plunger away from said impact tool holder, said first return spring being acted upon by translation of said solenoid plunger in a direction that causes said solenoid plunger to strike said impact tool holder, and a second return spring supported within said impact mechanism support portion of said housing and normally urging said impact tool holder toward said solenoid, said second return spring being acted upon by translation of said impact tool holder as a result of said solenoid plunger extension hammer striking said impact tool holder.

2. An electrically operated impact tool according to claim 1, wherein said housing further includes a grip portion by way of which said operator may seize said tool and operate said switch mechanism.

3. An electrically operated impact tool according to claim 1, wherein said utility device comprises a wire cutting device for cutting at least one wire for installation in a telephone wire termination block.

4. An electrically operated impact tool according to claim 1, wherein said first return spring comprises a first compression spring disposed within said axial passageway through said solenoid between said solenoid plunger and said impact tool holder, and wherein said second return spring comprises a second compression spring disposed between a cap portion of said impact tool holder and a region of said impact mechanism support portion of said housing.

5. An electrically operated impact tool according to claim 4, further including a cushion element disposed at said region of said impact mechanism support portion of said housing, such that said second compression spring is disposed between said cap portion of said impact tool holder and said cushion element at said region of said impact mechanism support portion of said housing.

6. An electrically operated impact tool according to claim 5, wherein said cap portion of said impact tool holder comprises an end cap that is solid with a first shaft end portion of said impact tool holder, such that said first compression spring is disposed between said solenoid plunger and said end cap, and said second compression spring is disposed between said end cap and said cushion element.

7. An electrically operated impact tool according to claim 4, further including a solenoid plunger rebound cushion disposed in said impact mechanism support portion of said housing adjacent to said solenoid plunger.

8. An electrically operated impact tool according to claim 4, wherein said solenoid control circuit is operative to provide adjustment of the energy supplied to said solenoid and thereby control the impact force imparted by said solenoid plunger extension hammer to said impact tool holder.

9. An electrically operated impact tool according to claim 1, wherein said solenoid control circuit is operative to provide adjustment of the energizing current supplied to said solenoid and thereby control the impact force imparted by said solenoid plunger extension hammer to said impact tool holder.

10. An electrically operated impact tool according to claim 9, wherein said solenoid control circuit includes an energizing current supply switch coupled in circuit with a power supply and said solenoid, and a switch control circuit, which is responsive to the operation of said switch mechanism and is operative to render said energizing current supply switch conductive for a prescribed period of time and thereby apply energizing current therethrough to said solenoid.

11. An electrically operated impact tool according to claim 10, wherein said switch control circuit is operative to render said energizing current supply switch conductive for a selected one of a plurality of different periods of time and thereby apply a selected duration of energizing current therethrough to said solenoid.

12. An electrically operated impact tool according to claim 11, wherein said power supply circuit is arranged to be coupled to a source of AC power, and wherein said switch control circuit includes a timing signal generator circuit, which is enabled by the operation of said switch mechanism, and generates a timing signal referenced to an AC voltage signal derived from said source of AC power, said timing signal being coupled to said energizing current supply switch, and having an energizing current supply switch enabling signal component, the duration of which corresponds to said prescribed period of time.

13. An electrically operated impact tool according to claim 12, wherein said solenoid control circuit is coupled to receive and be powered by an AC line voltage signal, and includes a line voltage conditioning circuit, which is operative to clip and control the rate of rise of the line voltage signal as a conditioned line voltage signal, said conditioned line voltage signal being applied to said timing signal generator circuit in response to the operation of said switch mechanism.

14. An electrically operated wire seating tool, for seating a wire in a wire termination block, comprising a housing which includes an impact mechanism supporting barrel, and having a switch through which an operator causes a solenoid winding control circuit to output energizing current to a solenoid winding that is supported within a generally longitudinal passageway of said impact mechanism supporting barrel, said solenoid winding having an axial passageway therethrough, which is sized to accommodate the translation of a solenoid plunger along a longitudinal axis of said generally longitudinal passageway, generally longitudinal solenoid plunger extension hammer attached to said solenoid plunger, a wire seating tool holder supported within said generally longitudinal passageway such that it is struck by said solenoid plunger extension hammer by the energization of said solenoid winding in accordance with the operation of said solenoid winding control circuit, and being coupled to a wire seating tool, a first solenoid plunger return compression spring supported within said generally longitudinal passageway through said solenoid winding and normally urging said solenoid plunger away from said wire seating tool holder, said first solenoid plunger return compression spring being compressed by translation of said solenoid plunger in a direction that causes said solenoid plunger extension hammer to strike said wire seating tool holder, and a second, wire seating tool holder return compression spring supported within said generally longitudinal passageway and normally urging said wire seating tool holder toward said solenoid winding, said second, wire seating tool holder return compression spring being compressed by translation of said wire seating tool holder as a result of said solenoid plunger extension hammer striking said wire seating tool holder.

15. An electrically operated wire seating tool according to claim 14, wherein said first solenoid plunger return compression spring is disposed between said solenoid plunger and said wire seating tool holder, and wherein said second wire seating tool holder return compression spring is disposed between an end portion of said wire seating tool holder and a region of said generally longitudinal passageway of said barrel.

16. An electrically operated wire seating tool according to claim 15, further including a cushion element disposed at said region of said generally longitudinal passageway of said barrel, such that said second, wire seating tool holder compression Spring is disposed between said end element portion of said wire seating tool holder and said cushion element at said region of said generally longitudinal passageway of said barrel.

17. An electrically operated wire seating tool according to claim 16, wherein said end element portion of said wire seating tool holder comprises an end cap that is solid with a first shaft end portion of said wire seating tool holder, such that said first solenoid plunger return compression spring is disposed between said solenoid plunger and said end cap, and said second, wire seating tool holder compression spring is disposed between said end cap and said cushion element.

18. An electrically operated wire seating tool according to claim 15, further including a solenoid plunger rebound cushion disposed in said generally longitudinal passageway of said barrel adjacent to said solenoid plunger.

19. An electrically operated wire seating tool according to claim 14, wherein said solenoid control circuit is operative to provide adjustment of the duration of energizing current supplied to said solenoid winding and thereby control the magnitude of impact force imparted by said solenoid plunger extension hammer to said wire seating tool holder.

20. An electrically operated wire seating tool according to claim 19, wherein said solenoid winding control circuit includes an energizing current supply switch coupled in circuit with a power supply and said solenoid winding, a trigger mechanism, and a switch control circuit, which is responsive to the operation of said trigger mechanism by a tool operator, and is operative to enable said energizing current supply switch for a prescribed period of time and thereby apply an associated duration of energizing current therethrough to said solenoid winding.

21. An electrically operated wire seating tool according to claim 20, wherein said switch control circuit is operative to enable said energizing current supply switch for a selected one of a plurality of different periods of time and thereby apply a selected one of a plurality of associated durations of energizing current therethrough to said solenoid winding.

22. An electrically operated wire seating tool according to claim 21, wherein said power supply circuit is arranged to be coupled to a source of AC power, and wherein said switch control circuit includes a timing signal generator circuit, which is enabled by the operation of said trigger mechanism, and generates a timing signal referenced to an AC voltage signal derived from said source of AC power, said timing signal being coupled to said energizing current supply switch, and having an energizing current supply switch enabling signal component the duration of which corresponds to said prescribed period of time.

23. An electrically operated seating tool according to claim 22, wherein said solenoid winding control circuit is coupled to receive and be powered by an AC line voltage signal, and includes a line voltage conditioning circuit, which is operative to clip and control the rate of rise of the line voltage signal as a conditioned line voltage signal, said conditioned line voltage signal being applied to said timing signal generator circuit in response to the operation of said trigger mechanism.

24. A pistol-configured, solenoid driven seating and cutting tool that is operative to seat and cut at least one wire in response to an operator holding the tool and squeezing a trigger, comprising a pistol-shaped grip that is contiguous with a generally cylindrically shaped main barrel body, which has a nose portion extending therefrom, said main barrel body containing a solenoid winding having a passageway therethrough that accommodates the translation of a solenoid plunger along a longitudinal axis of said barrel, a solenoid plunger extension hammer extending from said solenoid plunger, so that said solenoid plunger extension hammer extends into said solenoid passageway, a solenoid plunger return compression spring within said passageway through said solenoid winding and surrounding said solenoid plunger extension hammer, a wire seating and cutting tool holder axially translatable within said nose portion and being configured to receive a shaft of a wire seating and cutting tool, and having a neck surrounded by a tool holder return compression spring, and further including a solenoid control circuit having an energizing current supply switch coupled in circuit with a power supply and said solenoid winding, and a switch control circuit, which is responsive to the squeezing of said trigger to render said energizing current supply switch conductive for a prescribed period of time and thereby apply firing current to said solenoid winding, causing translation of said solenoid plunger and said solenoid plunger extension hammer so that said tool holder is struck by said solenoid plunger extension hammer, so as to seat and cut a wire.

25. A pistol-configured, solenoid driven and seating and cutting tool according to claim 24, wherein said solenoid plunger return compression spring normally urges said solenoid plunger away from said tool holder, and is acted upon by translation of said solenoid plunger in a direction that causes said solenoid plunger to strike said tool holder, and wherein said tool holder return spring is supported within said nose portion and normally urges said tool holder toward said solenoid winding, and is being acted upon by translation of said tool holder as a result of said solenoid plunger extension hammer striking said tool holder.

26. A pistol-configured, solenoid driven and seating tool according to claim 25, wherein said switch control circuit is operative to enable said energizing current supply switch for a selected one of a plurality of different periods of time and thereby apply a selected one of a plurality of associated durations of energizing current therethrough to said solenoid winding.

27. A pistol-configured, solenoid driven and seating tool according to claim 26, wherein said power supply circuit is arranged to be coupled to a source of AC power, and wherein said switch control circuit includes a timing signal generator circuit, which is enabled by the squeezing of said trigger, and generates a timing signal referenced to an AC voltage signal derived from said source of AC power, said timing signal being coupled to said energizing current supply switch, and having an energizing current supply switch enabling signal component the duration of which corresponds to said prescribed period of time.

28. An electrically operated impact tool according to claim 1, wherein said solenoid control circuit is operative to supply an energizing current pulse to said solenoid, in response to the operation of said switch mechanism by an operator, so as to supply an energizing current pulse to said solenoid, said solenoid control circuit comprising an energizing current supply switch coupled in a circuit path with an AC power supply input and said solenoid, and a switch control circuit, which is responsive to the operation of said switch mechanism and is operative to cause one and only one solenoid energizing current pulse, referenced to an AC voltage signal derived from said AC power supply, to be applied to said solenoid.

29. An electrically operated wire-seeking tool according to claim 14, comprising an energizing current supply switch coupled in a circuit path with an AC power supply input and said solenoid, and a switch control circuit, which is responsive to the operation of said switch mechanism and is operative to cause one and only one solenoid energizing current pulse, referenced to an AC voltage signal derived from said AC power supply, to be applied to said solenoid.

30. A pistol-configured, solenoid driven seeking and cutting tool according to claim 24, wherein said solenoid control circuit is operative to supply an energizing current pulse to said solenoid winding in response to said squeezing of said trigger, said solenoid control circuit comprising an energizing current supply switch coupled in a circuit path with an AC power supply input and said solenoid, and a switch control circuit, which is responsive to the operation of said switch mechanism and is operative to cause one and only one solenoid energizing current pulse, referenced to an AC voltage signal derived from said AC power supply, to be applied to said solenoid.

31. An electrically operated impact tool according to claim 1, further including a shock-absorbing cushion sleeve member supported within said impact mechanism support portion of said housing.

32. An electrically operated wire seating tool according to claim 14, further including a shock-absorbing cushion sleeve member supported within said generally longitudinal passageway.

33. A pistol-configured, solenoid driven seeking and cutting tool according to claim 24, further including a shock-absorbing cushion sleeve member supported within said nose portion.

* * * * *